United States Patent [19]

Hayduk, Jr. et al.

[11] Patent Number: 4,965,092

[45] Date of Patent: * Oct. 23, 1990

[54] PROCESS FOR THE MANUFACTURE OF COPPER THICK-FILM CONDUCTORS USING AN INFRARED FURNACE

[76] Inventors: Edward A. Hayduk, Jr., 1219 Eagle St., Wescosville, Pa. 18106; Walter F. Yext, 418 N. 8th St., Allentown, Pa. 18102; David R. Taschler, R.D. #1, Box 243BB, Lyon Valley Farm Rd., Schnecksville, all of Pa. 18078

[*] Notice: The portion of the term of this patent subsequent to Nov. 11, 2003 has been disclaimed.

[21] Appl. No.: 345,379

[22] Filed: Apr. 28, 1989

Related U.S. Application Data

[63] Continuation of Ser. No. 100,382, Sep. 24, 1987, abandoned.

[51] Int. Cl.$^5$ ............................................. C23C 26/00
[52] U.S. Cl. ........................................ 427/96; 427/55; 427/66; 427/67
[58] Field of Search .................... 427/96, 55, 66, 67

[56] References Cited

U.S. PATENT DOCUMENTS

| | | | |
|---|---|---|---|
| 4,234,367 | 11/1980 | Herron | 427/96 |
| 4,551,357 | 11/1985 | Takeuchi | 427/96 |
| 4,622,240 | 11/1986 | Yext | 427/96 |
| 4,627,160 | 12/1986 | Herron | 427/96 |

OTHER PUBLICATIONS

Hackh's Chemical Dictionary, McGraw-Hill, 4th ed, 1972, p. 346.

*Primary Examiner*—Shrive Beck
*Assistant Examiner*—Vi Duong Dang
*Attorney, Agent, or Firm*—James C. Simmons; William F. Marsh

[57] ABSTRACT

Water added to the furnace heated by an infrared or near-infrared radiation source used to fire thick-film electrical components provides finished components exhibiting desirable physical and electrical properties and surface cleanliness.

10 Claims, No Drawings

PROCESS FOR THE MANUFACTURE OF COPPER THICK-FILM CONDUCTORS USING AN INFRARED FURNACE

TECHNICAL FIELD

The present invention pertains to the manufacture of thick-film circuits or electrical networks by applying paste containing conductive materials onto a ceramic substrate by means of a screen or mask followed by drying and firing under atmosphere and elevated temperature in a infrared furnace to fix the paste to the substrate.

BACKGROUND OF THE PRIOR ART

Microelectric circuits formed by means of thick-film technology are fabricated by using a paste formulated from a material which includes a conductor, resistor or dielectric. The paste is formulated using metal powders, a glass frit powder, binders and vehicles and placed or deposited (e.g.-by screen printing) in a selected pattern onto a non-conductive substrate (e.g. ceramic, porcelainized steel, glass, etc.), and then dried to volatilize vehicle constituents contained in the paste such that it can then be fired to sinter or fuse the constituents bonding the film to the substrate.

In the past, the conductors have been made using a precious metal conductive paste prepared by using a noble metal or combination of noble metals such as platinum, palladium, silver or gold to permit electrical flow with minimal opposition.

The thick-film microelectronic circuit industry has begun to replace the precious metal conductors with copper conductors. This in turn has created a problem in that the copper conductor paste containing polymers, glass frit and copper metal together with other metal oxides must be processed in a nitrogen-based atmosphere. The use of the nitrogen-based atmosphere is dictated in order to prevent excessive oxidation of the copper. The previously used precious metal conductors could be fired in a furnace atmosphere of air because oxidation was not a problem. The lack of oxygen in the furnace atmosphere can greatly affect the behavior of the polymers and glass frit during firing which in turn affects physical and electrical characteristics of the fired conductor. Because there is insufficient oxygen present to effectively oxidize the carbon-based polymers and keep various metal oxides from reducing, pyrolyzation or volatilization of the polymeric or metallic constituents can cause sooting problems in the furnace and on the parts. Condensation of the vaporized vehicle or volatilized metals such as bismuth can occur on the cooler areas of the furnace. The sooting and condensation creates two problems for the thick-film manufacture, first, the condensed polymers that attach to the interior of the furnace walls make it necessary to clean the furnace on a regular basis to prevent deposits from dripping onto to the belt and the parts being processed, and, second, soot and condensed polymers deposit onto the surface of a copper conductor and the ceramic substrate. In order to solve the first problem, the furnace must be cooled to enable the cleaning operation to proceed thus diminishing available production time in the furnace. As to the second problem, deposits on the surface of a conductor are aesthetically undesirable but furthermore can compromise the quality of the circuit during later processing steps such as wire bonding or soldering. Thus it is necessary to clean the substrates in some manner before proceeding to package the substrate causing added expense to the manufacturer.

Due to the fact that there is insufficient oxygen present in the furnace atmosphere, glass frit contained in the copper thick-film paste does not form the necessary bonding interface between the copper metal particles and the ceramic substrate. A lack of, or incomplete formation of, this bonding interface results in less than desirable adhesion strengths between the conductor and the ceramic substrate with concomitant increased resistivity.

In attempting to eliminate the vehicle burn-off problem and achieve optimum physical and electrical properties, present day manufacturers have taken several approaches. One approach is to inject small amounts D of oxygen (e.g. up to 1% by volume, normally 5 to 15 parts per million) have been added to the preheat or burn out zone of conventional infrared and near-infrared furnaces commonly used in the manufacture of thick-film components. At the low temperature and short residence time normally found in the preheat zone of these furnaces, the oxygen is not as severely oxidizing as at higher temperatures, but can oxidize some of the carbon-based vehicles and provide a slight oxidation potential to form the desired glassy bonding interface. This technique is not completely effective possibly because of the low temperatures in which the reactants are present. Oxidation of the copper could also occur should oxygen migrate into the hotter areas of the furnace, thus ruining the conductor. An other approach resides in the manufacturers making physical modifications to the furnaces, be they conventional, infrared or near-infrared in an attempt to evacuate the reaction products from the preheat zone more effectively. Although these methods have met with limited success D in removal of vehicles from the furnace, they require the use of large volumes of gas, thus increasing production costs. Another approach has been to modify the paste formulation in an attempt to eliminate the sooting problem and provide optimal conductivity, solderability and adhesion properties to the finished part, all with little proven success to date.

A more complete discussion of processes for manufacturing thickfilm electrical components is contained in the specification of U.S. Pat. No. 4.622.240 which is incorporated herein by reference.

SUMMARY OF THE INVENTION

It has been discovered that during the firing, in an infrared or near-infrared radiation furnace, of base metal thick-film electrical components made by conventional printing ink technology or other known circuit printing process or techniques such as ink jet printing or processes using photoresist techniques, the addition of small amounts of water vapor (e.g. 100 to 3.000 ppm) to the furnace atmosphere oxidizes the vehicle that is volatilized from the thick-film conductor. The products of oxidation (e.g. carbon monoxide and carbon dioxide) are easily swept from the furnace by the furnace atmosphere. Water additions can be added to the preheat zone, the hot zone, or both for a given furnace Utilizing water injection as set forth herein, additions of nitrous oxide can be made into the hot zone and/or the preheat zone of the furnace to improve vehicle removal in accord with the teaching of U.S. Pat. No. 4.622.240. This satisfactory removal of organic components is done without the degradation of the adhesion of the conductor to the substrate as would be expected in conventional, non-infrared furnaces.

DESCRIPTION OF THE PREFERRED EMBODIMENTS

When processing large volumes of copper thick-film paste in producing thick-film electrical components, the continuous belt furnace in nitrogen-based atmosphere play key roles in obtaining a product that exhibits desirable physical and electrical properties. Processing such components in a standard nitrogen atmosphere with minimal oxygen and moisture content often results in less than desirable conductor properties in one or more areas such as resistance, solderability, initial and aged adhesion and surface cleanliness. Undesirably low initial and D aged adhesion as well as poor surface cleanliness can result from firing copper conductors in conventional and infrared radiation-type furnaces if an insufficient amount and/or an inappropriate oxidizer (oxygen, nitrous oxide, carbon dioxide, etc.) is added to the atmosphere. Excessive amounts of any of these additives can also lead to poor adhesion, solderability, and conductivity. The present invention combines the use of an infrared or near-infrared radiation-type furnace with controlled additions of water to the inert nitrogen atmosphere to produce copper thickfilm electrical components that exhibit superior electrical and physical properties. The same controlled additions of water vapor to the inert atmosphere of a conventional heated furnace produced inferior copper thick-films. Infrared, near-infrared and conventional furnaces are differentiated by the predominant wavelength of radiation admitted by the furnace heat source as set out below:

| FURNACE TYPE | WAVELENGTH (angstroms) |
|---|---|
| Conventional | >100,000 |
| Infrared | >20,000 <100,000 |
| Near-Infrared | >7,000 <20,000 |

In accord with the process of the present invention, copper thickfilm conductors are screen printed onto a ceramic substrate (e.g. 96% alumina). The parts are then processed in an infrared or near infrared radiation belt furnace according to the following regime:

The furnace is maintained at a temperature between 850 and 1.000° C. The parts are processed using heat up and cool down rates so that the entire process takes from 10 to 30 minutes. The total time at firing temperature (850 to 1,000° C.) is approximately 1 to 7 minutes.

One particular furnace that is effective in the process is a model Cu-900 manufactured by Radiant Technology Corporation, Cerritos, CA. This furnace employs a tungsten filament quartz lamp emitting radiation source in wavelengths of between 4.000 and 100.000 angstrom units, but primarily between 4.000 and 45.000 angstrom units. The furnace atmosphere contains nitrogen to which is added between 100 and 3.000 parts per million of water in the hot zone or the preheat zone and contains less than 500 ppm oxygen in the preheat zone and less than 100 ppm oxygen in the hot zone.

In place of the nitrogen, argon could be used as the inert gas source.

In accord with the present invention, several tests were run comparing the copper thick-film conductors prepared as set out above and fired in a conventional furnace and in an infrared furnace of the type noted above. The results of these tests are set forth in Table 1.

TABLE I

| | | | PROPERTIES | | | |
|---|---|---|---|---|---|---|
| TEST No. | ATMOSPHERE (PPM $O_2$) | $H_2O$ PPM | RESISTIVITY (MILLI-OHMS/□) | SOLDERABILITY (MILLI-NEWTONS/mm) | ADHESION (lbs/in$^2$) | |
| | | | | | Initial | Aged |
| I CF[a] | 1 | 23 | 3.42 | .45 | 531 | 547 |
| II CF | 17 | <23 | 3.59 | 0 | 547 | 563 |
| III CF | 5 | 127 | 3.14 | .43 | 547 | 359 |
| IV CF | 5 | 750 | 3.14 | .52 | 359 | 0 |
| V CF | 5 | 3300 | 2.43 | .53 | 188 | 0 |
| I IF[b] | 5 | 63 | 3.2 | .47 | 499 | 312 |
| II IF | 10 | 110 | 3.1 | .35 | 717 | 689 |
| III IF | 5 | 324 | 3.0 | .40 | 312 | 243 |
| IV IF | 5 | 930 | 3.0 | .41 | 404 | 306 |
| V IF | 5 | 1980 | 3.0 | .40 | 686 | 569 |

[a]CF - Conventional Furnace
[b]IF - Infrared Furnace

In performing the tests set out in Table I initial adhesion is measured immediately after the parts exit the furnace. Aged adhesion is measured after the parts are aged at 85° C under an atmosphere of air having a relative humidity of 85% for 24 hours. In reviewing the results set forth in Table I it should be noted that Tests I CF through V CF were conducted in a conventional furnace (e.g. having heat sources emitting radiations in wavelengths higher than 100,000 angstrom units). Test I CF sets forth the base condition for the conventional furnace wherein there is no intentional addition of water to the atmosphere nor is there an intentional oxygen addition to the atmosphere. Tests III CF through V CF show the gradual addition of water vapor to the furnace atmosphere. Test II CF shows the addition of oxygen to the atmosphere without the addition of water vapor. It will be noted that when water vapor was added to the conventional furnace atmosphere, the adhesion properties of the resultant thick-film component were unacceptable. The addition of oxygen to the atmosphere, while not affecting the adhesion properties, destroyed the solderability property since a minimum value of 0.40 is acceptable for solderability.

Examining results I IF through V IF show that for the base case (I IF) there was a significant decrease in aged adhesion compared to case ICF. When gradual additions of water vapor were tested (III IF, IV IF and V IF), while the adhesion decreased after aging the results were found to be acceptable and the solderability was also found to be acceptable for these components. The fact that the adhesion was acceptable for samples processed according to the invention was totally unexpected since addition of water of similar magnitude in the conventional furnace showed drastically reduced aged adhesion. Sample II IF with an increased oxygen addition to the furnace showed a high value for adhesion, but without the significant water addition there was a loss of acceptable solderability.

In all of the tests set forth in Table I. noted I IF through V IV. there was no observed deposition of soot on the product nor on the furnace, thus overcoming the problem of the prior art processes.

From the foregoing description and Table I; I presume it is apparent that the process of the present invention utilizing water additions to the inert atmosphere used in an infrared or near infrared furnace, results in a wide range of concentrations in which the water is effective to produce acceptable thick-film components. Furthermore, the process of the present invention enables the user to combine water additions with other additives such as nitrous oxide and oxygen to achieve the desired results. Also. there is a reduction of atmosphere consumption and an elimination of polymeric and metallic deposits while maintaining the physical and electrical properties of the thick-film conductor.

Furthermore, in accord with the process of the present invention, between 10 and 20.000 parts per million nitrous oxide can be injected in the hot zone and/or the preheat zone of the furnace in combination with the injection of the water to achieve the finished parts.

The process of the present invention will increase production capacity by diminishing the furnace down time through elimination of frequent furnace cleanings, produce electronic ceramic circuits that are clean thus eliminating extra time to clean them before further processing. decrease the number of rejected parts that result from sooting or polymeric deposits on the ceramic or copper conductor, eliminate the need for extensive furnace redesign, minimize the total furnace atmosphere flow necessary to fire copper thick-film circuits resulting in reduced processing costs and will produce copper-thick film circuits with superior physical and electrical properties (e.g. solderability, conductivity, adhesion, cleanliness, etc.) but not at the expense of any one property.

Having thus described our invention it was desired to be secured by Letters Patent of the United States as set forth in the following claims.

We claim:

1. In a process of manufacturing thick-film electrical components by forming a paste suitable for application to a ceramic substrate, applying said paste to said substrate by a conventional screen printing technique, drying said printed substrate and firing said substrate and said paste at elevated temperature in a furnace heated by a radiant energy source having a wavelength greater than 4,000 but less than 100,000 angstroms to form said electrical component, the improvement comprising:

firing said paste and substrate composite in a hot zone of said furnace maintained at a temperature of between 850° and 1,000° C. under an inert gas atmosphere to which is added from 100 to 3,000 ppm water whereby said fired composites exhibit enhanced adhesion of said paste to said substrate.

2. A process according to claim 1 wherein said radiant energy source has a wavelength between 4,000 and 25,000 angstroms.

3. A process according to claim 1 wherein said radiant energy source has a wavelength between 25,000 and 100,000 angstroms.

4. A process according to claim 1 wherein said water addition is between 100 and 2,000 ppm by volume.

5. A process according to claim 1 wherein said paste and ceramic components are held in the hot zone of said furnace for a period of time varying between 1 and 7 minutes.

6. A process according to claim 1 wherein said furnace permits pre-heating, firing in a hot zone and cooling of said paste and composite substrate and wherein the entire process takes between 10 and 30 minutes.

7. A process according to claim 1 wherein the inert gas atmosphere is nitrogen.

8. A process according to claim 1 wherein the inert gas atmosphere is argon.

9. A process according to claim 1 wherein between 10 and 20,000 ppm nitrous oxide is added to the inert gas-water atmosphere in the hot zone of said furnace.

10. A process according to claim 1 wherein the furnace contains a preheat zone maintained under an inert gas atmosphere to which is added between 100 and 3,000 ppm water.

* * * * *